US012796001B2

(12) United States Patent
Hwang et al.

(10) Patent No.: US 12,796,001 B2
(45) Date of Patent: Nov. 10, 2026

(54) SEMICONDUCTER DEVICE AND FABRICATING METHOD THEREOF

(71) Applicant: SAMSUNG ELECTRONICS CO., LTD., Suwon-si (KR)

(72) Inventors: Inchan Hwang, Suwon-si (KR); Myungil Kang, Suwon-si (KR); Donghoon Hwang, Suwon-si (KR); Kyungho Kim, Suwon-si (KR); Sungwoo Jang, Suwon-si (KR); Kyung Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 536 days.

(21) Appl. No.: 18/329,830

(22) Filed: Jun. 6, 2023

(65) Prior Publication Data

US 2024/0145567 A1 May 2, 2024

(30) Foreign Application Priority Data

Nov. 1, 2022 (KR) ........................ 10-2022-0143807

(51) Int. Cl.
*H10D 30/67* (2025.01)
*H10D 30/01* (2025.01)
(Continued)

(52) U.S. Cl.
CPC ....... *H10D 30/6735* (2025.01); *H10D 30/014* (2025.01); *H10D 30/43* (2025.01); *H10D 62/121* (2025.01); *H10D 64/017* (2025.01)

(58) Field of Classification Search
CPC .. H10D 30/6735; H10D 30/014; H10D 30/62; H10D 30/024; H10D 64/017; H10D 64/512; H10D 30/673; H10D 30/43; H10D 30/6757; H10D 62/121; H10D 30/0616; H10D 30/502; H10D 30/506;
(Continued)

(56) References Cited

U.S. PATENT DOCUMENTS 8,735,235 B2 5/2014 Chuang et al.
9,202,691 B2 12/2015 Huang et al.
(Continued)

FOREIGN PATENT DOCUMENTS

KR 10-2016-0122475 A 10/2016

*Primary Examiner* — Julio J Maldonado
*Assistant Examiner* — Paul A Berry
(74) *Attorney, Agent, or Firm* — MORGAN, LEWIS & BOCKIUS LLP

(57) ABSTRACT

A semiconductor device includes: an active area that protrudes from an upper surface of a substrate and extends parallel to the upper surface of the substrate; an element isolating area formed on the substrate and around the active area; a channel formed on an upper surface of the active area; a gate structure that surrounds at least two surfaces of the channel; a spacer formed on both sidewalls of the gate structure; and a source/drain layer in contact with both sidewalls of the channel and insulated from the gate structure by the spacer. The gate structure includes, in a cross-section, a first portion whose width in a first direction increases from an upper portion of the gate structure toward a lower portion closer to the substrate, and a second portion whose width in the first direction remains the same or decreases below the first portion.

7 Claims, 25 Drawing Sheets

(51) Int. Cl.
*H10D 30/43* (2025.01)
*H10D 62/10* (2025.01)
*H10D 64/01* (2025.01)

(58) Field of Classification Search
CPC .. H10D 30/508; H10D 62/118; H10D 62/235; H10D 30/021; H10D 30/60; H10D 84/83138; H10D 64/01324; H10D 64/01362; H10D 64/20; H10D 64/518; H10D 30/501; H10D 30/019; H10D 30/0213; H10D 30/0297; H10D 30/289; H10D 64/021; H10D 64/025; H10D 64/027; H10D 64/311; H10D 64/516; H10D 30/694; H10D 30/6217; H10D 30/6219
See application file for complete search history.

(56) References Cited

U.S. PATENT DOCUMENTS

| | | | | |
|---|---|---|---|---|
| 10,522,682 | B2 * | 12/2019 | Yoon | H10D 30/62 |
| 11,043,424 | B2 | 6/2021 | Huang | |
| 11,342,458 | B2 | 5/2022 | Chang et al. | |
| 2010/0044783 | A1 | 2/2010 | Chuang et al. | |
| 2014/0203333 | A1 | 7/2014 | Huang et al. | |
| 2016/0307927 | A1 * | 10/2016 | Lee | H10D 62/117 |
| 2019/0157444 | A1 * | 5/2019 | Yang | B82Y 10/00 |
| 2019/0305105 | A1 | 10/2019 | Gao et al. | |
| 2019/0371887 | A1 * | 12/2019 | Frougier | B82Y 10/00 |
| 2020/0381537 | A1 | 12/2020 | Lin et al. | |
| 2021/0043773 | A1 | 2/2021 | Chang et al. | |
| 2022/0130977 | A1 * | 4/2022 | Lin | H10D 30/014 |
| 2025/0220988 | A1 | 7/2025 | Lee et al. | |

* cited by examiner

SEMICONDUCTER DEVICE AND FABRICATING METHOD THEREOF

CROSS-REFERENCE TO RELATED APPLICATION

This application claims priority under 35 USC § 119 from Korean Patent Application No. 10-2022-0143807, filed in the Korean Intellectual Property Office on Nov. 1, 2022, the contents of which are herein incorporated herein by reference in their entirety.

TECHNICAL FIELD

Embodiments of the present disclosure are directed to a semiconductor device and a fabricating method thereof.

DISCUSSION OF THE RELATED ART

Recently, semiconductor devices have become reduced insize and increased in performance. Accordingly, a small structural difference between transistors in a semiconductor device can affect performance of the semiconductor device. In general, a transistor includes a polysilicon gate electrode. However, to satisfy performance requirements, the polysilicon gate electrode is being replaced by a metal gate electrode. One method of implementing a metal gate electro de is a “gate last process” or a “replacement gate process”. However, in a transistor such as a fin field effect transistor (FinFET), a gate all around FET (GAAFET), a multi-bridge channel FET (MBCFET), or a ForkFET in which a transistor channel is inserted into the metal gate electrode, and perfectly vertically etching a sidewall is challenging. For example, a skirt that has a shape that spreads toward a lower portion closer to a substrate is formed under the dummy gate electrode.

The skirt of the dummy gate electrode becomes thinner at a lower portion of a spacer that insulates the metal gate electrode and a source/drain, and a pinhole is formed in the lower portion of the spacer when the dummy gate electrode is etched.

As described above, when the pinhole is formed in the lower portion of the spacer, the source/drain is removed together with the dummy gate electrode during the gate last process or the replacement gate process, causing a yield decrease and a short circuit between the replaced metal gate electrode and the source/drain.

SUMMARY

An embodiment provides a semiconductor device that resolves issues caused by a skirt of a dummy gate structure.

An embodiment provides a fabricating method of a semiconductor device that resolves issues caused by a skirt of a dummy gate structure.

An embodiment of the present disclosure provides a semiconductor device that includes: an active area that protrudes in a direction perpendicular to an upper surface of a substrate and extends in a first direction parallel to the upper surface of the substrate; an element isolating area formed on the substrate and around the active area; a channel formed on an upper surface of the active area and that extends in the first direction; a gate structure that surrounds at least two surfaces of the channel and that extends in a second direction perpendicular to the first direction; a spacer formed on both sidewalls of the gate structure in the first direction; and a source/drain layer in contact with both sidewalls in the first direction of the channel and insulated from the gate structure by the spacer. The gate structure includes, in a cross-section, a first portion whose width in the first direction increases from an upper portion of the gate structure toward a lower portion closer to the substrate, and a second portion whose width in the first direction remains the same or decreases below the first portion.

The gate structure may surround one channel and an upper surface and a sidewall of the channel in the second direction.

The gate structure may surround a plurality of channels and upper and lower surfaces and sidewalls of at least some of the plurality of channels in the second direction.

The gate structure may include a gate insulating pattern and a gate electrode.

The gate electrode may include, in a cross-section, a first portion whose width in the first direction increases from an upper portion of the gate electrode toward a lower portion closer to the substrate, and a second portion whose width in the first direction remains the same below the first portion. The gate electrode may include, in a cross-section, a first portion whose width in the first direction increases from an upper portion of the gate electrode toward a lower portion closer to the substrate, and a second portion whose width in the first direction decreases below the first portion.

The gate electrode may include, in a cross-section, a first portion whose width in the first direction increases from an upper portion of the gate electrode toward a lower portion closer to the substrate, and a second portion whose width in the first direction decreases and then increases below the first portion.

An embodiment provides a fabricating method of a semiconductor device that includes: preparing a substrate that includes an active area and an element isolating area, where an active pattern that extends in a first direction is formed on the active area; forming a dummy gate structure that extends in a second direction perpendicular to the first direction on the element isolating area and the active pattern; forming a dummy dielectric layer on the active pattern, the element isolating area, and the dummy gate structure; selectively exposing a skirt whose shape spreads from a sidewall of the dummy gate structure in the first direction toward a lower portion closer to the substrate by an anisotropic top-down etching method; etching or oxidizing the exposed skirt; removing the dummy dielectric layer; forming a spacer on the sidewall of the dummy gate structure; forming a trench by etching the active pattern by using the dummy gate structure and the spacer as an etching mask; forming a source/drain layer in the trench; and removing the dummy gate structure and forming a gate structure.

The active pattern may include a plurality of active patterns. All of the plurality of active patterns formed on the substrate may be the same or different, and each of the active patterns may include a fin, a plurality of nanowires, and stacked nanosheets or a plurality of stacked nanosheets.

The dummy dielectric layer may be formed to have a thickness of 0.1 to 10 nm.

The anisotropic top-down etching method may be a reactive ion etching method.

When the exposed skirt is etched, the exposed skirt is etched by one of a dry etching method or a wet etching method.

When the exposed skirt is oxidized, the oxidized skirt may be removed together with the dummy dielectric layer in the removing of the dummy dielectric layer.

The dummy gate structure may include a dummy gate insulating pattern, a dummy gate electrode, and a dummy gate mask.

The exposed skirt may include a skirt of a dummy gate electrode and a skirt of a dummy gate insulating pattern.

When the exposed skirt is etched, the skirt of the dummy gate electrode may be etched by a wet etching method.

The removing of the dummy dielectric layer may include removing a skirt of the dummy gate insulating pattern exposed due to the removal of the skirt of the dummy gate electrode together with the dummy dielectric layer.

When the exposed skirt is etched, the skirt of the dummy gate electrode may be etched by a wet etching method.

The removing of the dummy dielectric layer may include removing a skirt of the dummy gate insulating pattern exposed due to the removal of the skirt of the dummy gate electrode together with the dummy dielectric layer.

When the exposed skirt is oxidized, the skirt of the dummy gate electrode may be oxidized, and the removing of the dummy dielectric layer may include removing an oxidized skirt of the dummy gate electrode and a skirt of the dummy gate insulating pattern together with the dummy dielectric layer.

According to a semiconductor device of an embodiment, an electrical short between a gate electrode and a source/drain layer can be suppressed, and a decrease in yield can be suppressed by preventing the source/drain layer from being damaged when a dummy gate structure is removed during a gate last process or a replacement gate process.

DETAILED DESCRIPTION

Figure 1:
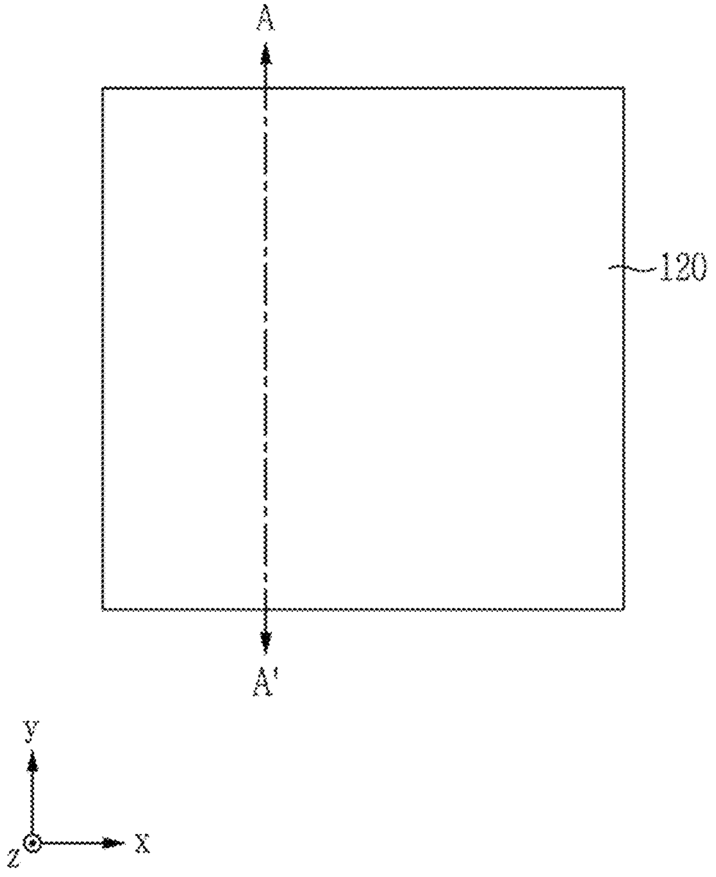
FIG. 1, FIG. 3, FIG. 5, FIG. 10, FIG. 19, and FIG. 21 are top plan views that illustrate steps of a fabricating method of a semiconductor device according to an embodiment.

Embodiments of the present disclosure will be described more fully hereinafter with reference to the accompanying drawings, in which embodiments of the disclosure are shown.

In the drawing, like reference numerals may designate like elements throughout the specification.

A semiconductor device according to an embodiment includes: an active area that protrudes in a direction perpendicular to an upper surface of a substrate and extends in a first direction parallel to the upper surface of the substrate; an element isolating area formed on the substrate and around the active area; a channel formed on an upper surface of the active area and that extends in the first direction; a gate structure that surrounds at least two surfaces of the channel and extends in a second direction perpendicular to the first direction; a spacer formed on both sidewalls of the gate structure in the first direction; and a source/drain layer in contact with both sidewalls of the channel in the first direction and insulated from the gate structure by the spacer. The gate structure includes: a first portion whose width in the first direction in a cross-section increases from an upper portion of the gate structure toward a lower portion closer to the substrate; and a second portion whose width in the first direction remains the same or decreases below the first portion.

A semiconductor device according to an embodiment may resolve issues caused by a skirt of an existing dummy gate structure. Accordingly, the semiconductor device may be a transistor such as a fin field effect transistor (FinFET), a gate all around FET (GAAFET), a multi-bridge channel FET (MBCFET), or a ForkFET in which a channel is inserted into a metal gate electrode.

In an embodiment, when the semiconductor device is a FinFET, the gate structure surrounds one channel and an upper surface and a sidewall of the channel in the second direction.

In other embodiments, when the semiconductor device is a GAAFET, an MBCFET, or a ForkFET, the gate structure surrounds a plurality of channels and upper and lower surfaces and sidewalls of at least some of the plurality of channels in the second direction.

The sidewall and the upper and lower surfaces of the channel are not necessarily flat surfaces, and when the channel is a nanowire, the sidewall and the upper and lower surfaces of the channel are curved surfaces.

Referring to FIG. 21 and FIG. 23 to FIG. 25, a semiconductor device according to an embodiment includes, in a cross-section of the sidewall of the channel in the first direction, a gate structure includes a first portion whose width in the first direction increases from an upper portion of the gate structure toward a lower portion closer to the substrate exists, and a second portion that has the same width in the first direction or a narrower width in the first direction, at a lower portion than the first portion.

For example, a gate structure 310 includes a gate insulating pattern 280 and a gate electrode 300.

Figure 23:
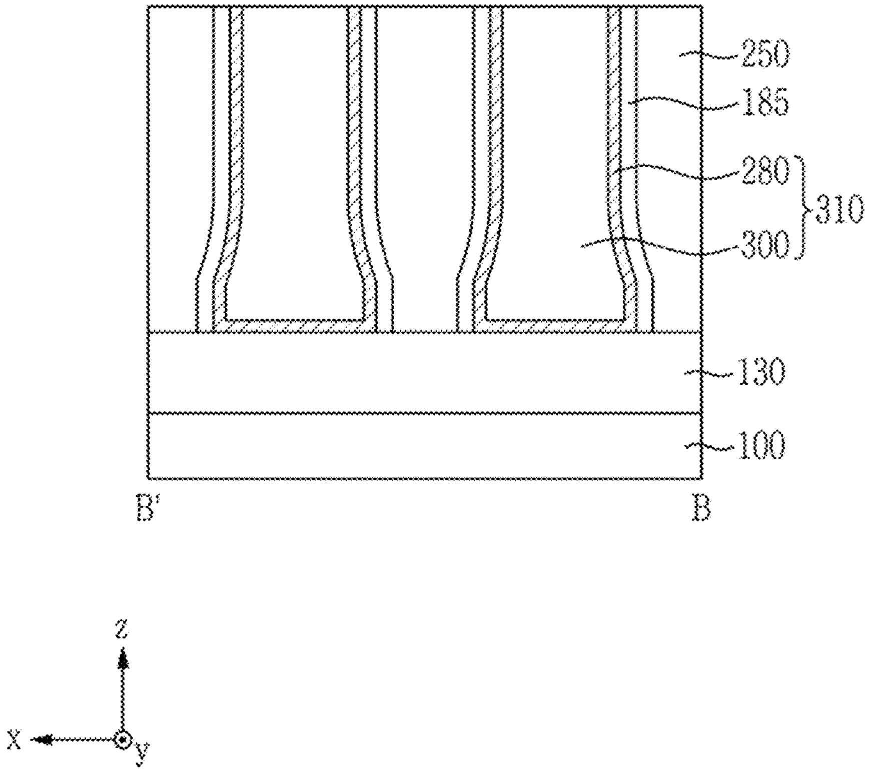
FIG. 23 to FIG. 25 are cross-sectional views of a shape of a gate structure of a semiconductor device according to an embodiment.

For example, the gate electrode 300 has the above-described cross-sectional shape. Referring to FIG. 23, in an embodiment, the gate electrode 300 has, in a cross-section (B'-B) of the sidewall of the channel 124 in the first direction (x), a first portion whose width in the first direction (x) becomes wider from the upper portion of the gate electrode 300 toward the lower portion thereof closer to the substrate 100, and a second portion having the same width in the first direction (x) below the first portion.

Figure 24:
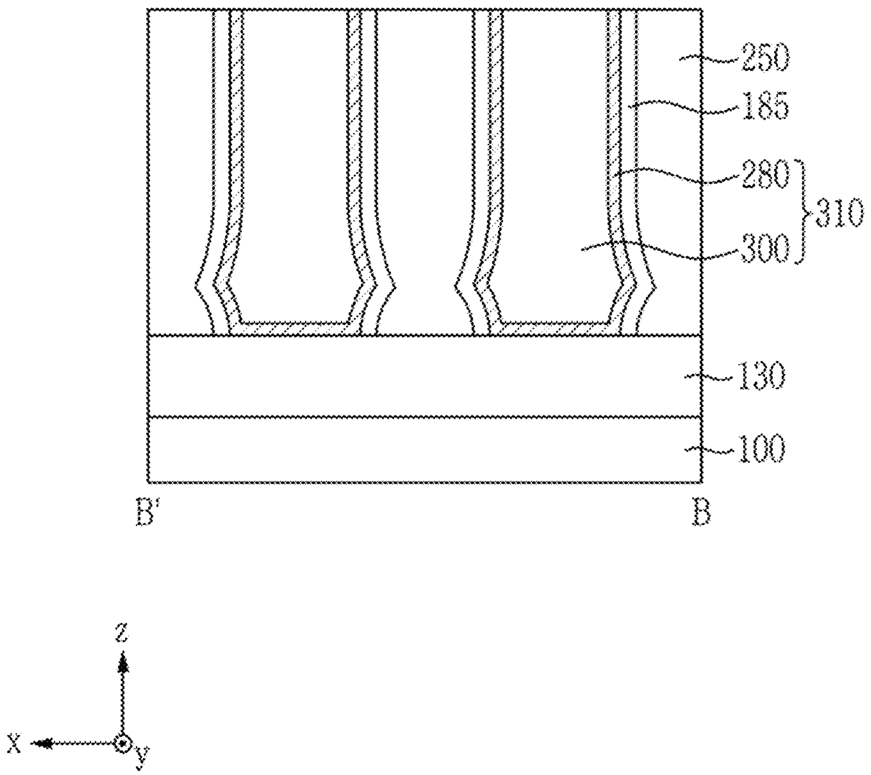

Referring to FIG. 24, in an embodiment, the gate electrode 300 has, in the cross-section (B'-B), a first portion whose width in the first direction (x) becomes wider from the upper portion of the gate electrode 300 toward the lower portion thereof closer to the substrate 100, and a second portion having a narrower width in the first direction (x) below the first portion.

Figure 25:
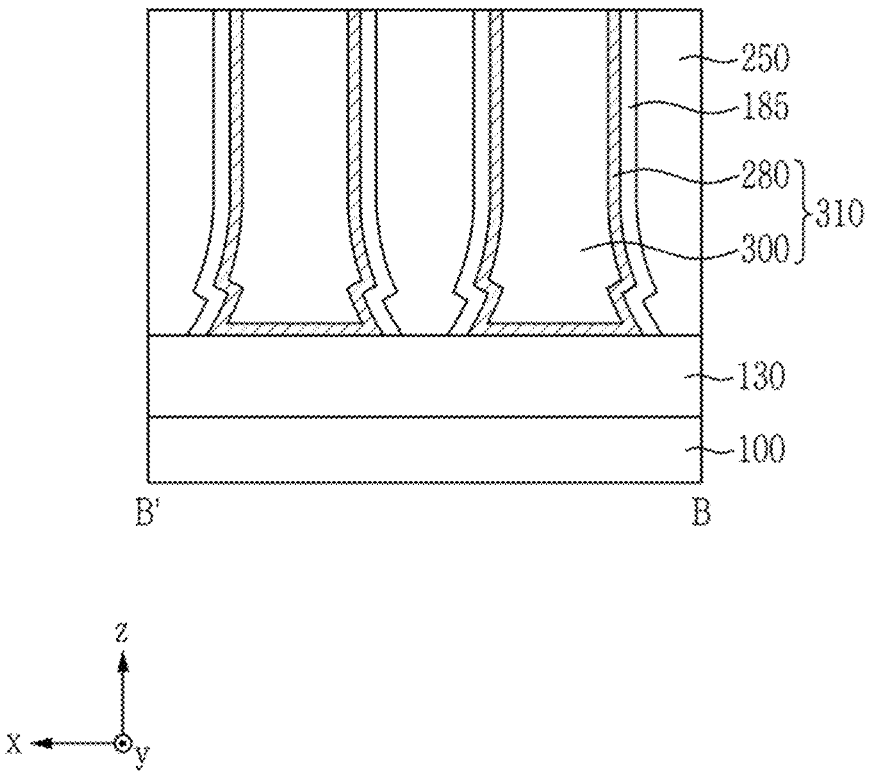

Referring to FIG. 25, in an embodiment, the gate electrode 300 has, in a cross-section (B'-B), a first portion in which a width of the gate electrode 300 in the first direction (x) becomes wider from the upper portion of the gate electrode 300 toward the lower portion thereof closer to the substrate 100, and a second portion that, below the first portion, becomes narrower in the first direction (x) and then becomes wider again.

Since a semiconductor device of an embodiment includes a gate structure of a shape described above, such as a gate electrode, an electrical short between the gate electrode and the source/drain layer can be suppressed, and the source/drain layer can be prevented from being damaged when the dummy gate structure is removed during a gate last process or a replacement gate process, thereby suppressing a decrease in yield.

Hereinafter, a fabricating method of a semiconductor device according to an embodiment will be described in detail with reference to FIG. 1 to FIG. 25.

As described above, a semiconductor device of an embodiment is a transistor such as one of a FinFET, a GAAFET, an MBCFET, or a ForkFET, but hereinafter, an embodiment in which the semiconductor device is an MBCFET will be described in detail.

Figure 2:
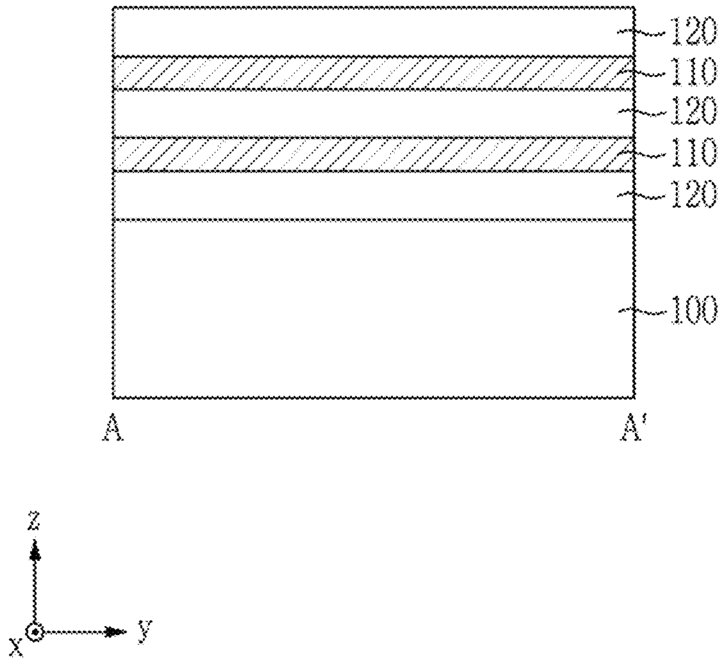
FIG. 2, FIG. 4, FIG. 6 to FIG. 8, FIG. 11 to FIG. 18, FIG. 20, and FIG. 22 are cross-sectional views that illustrate steps of a fabricating method of a semiconductor device according to an embodiment.
Figure 3:
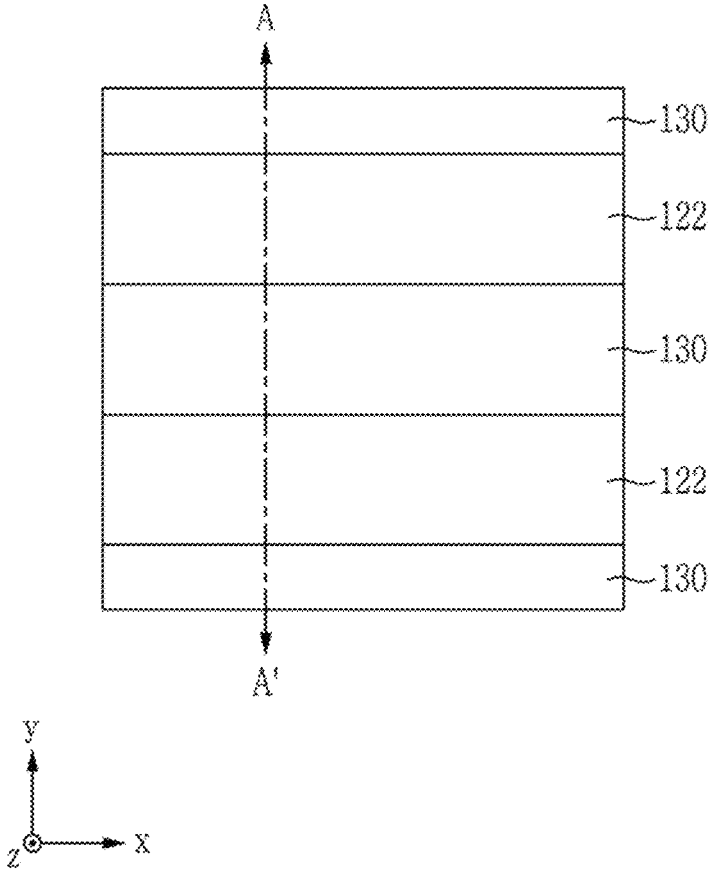
Figure 4:
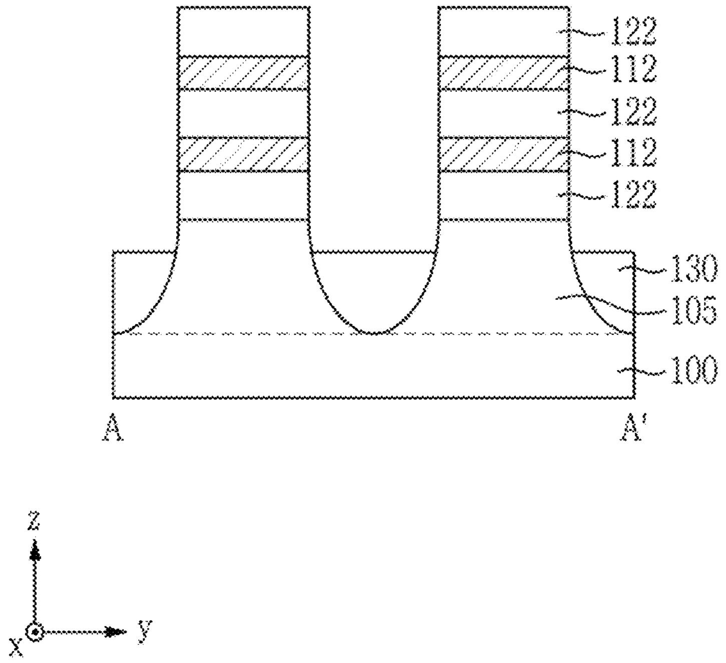
Figure 5:
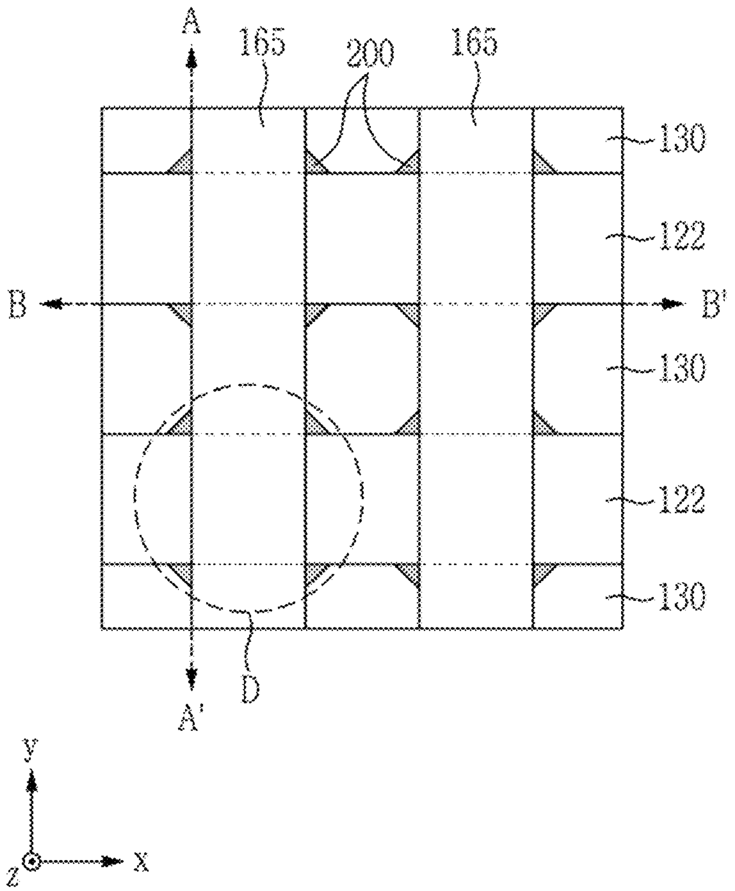
Figure 6:
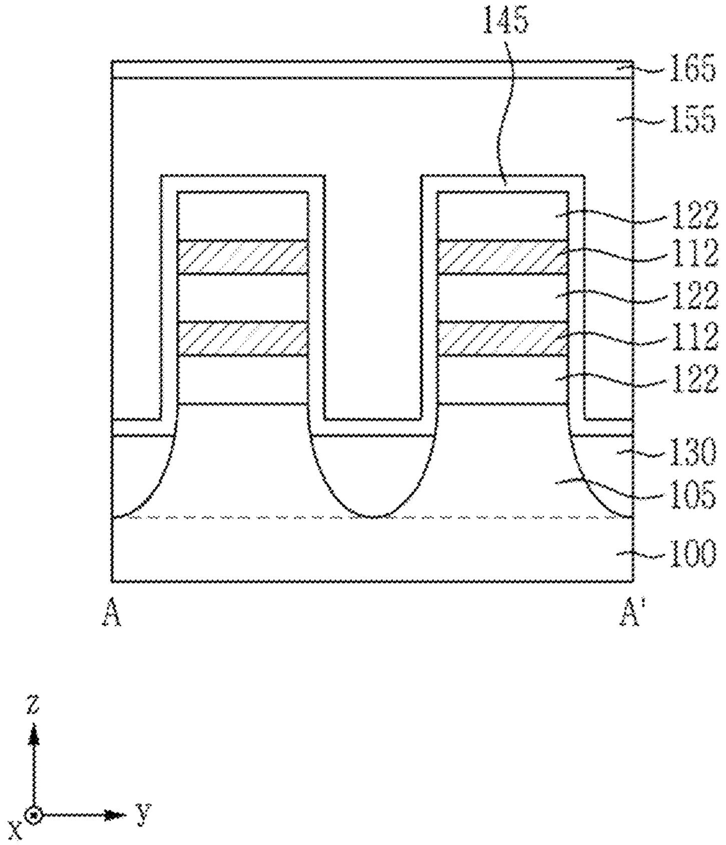
Figure 7:
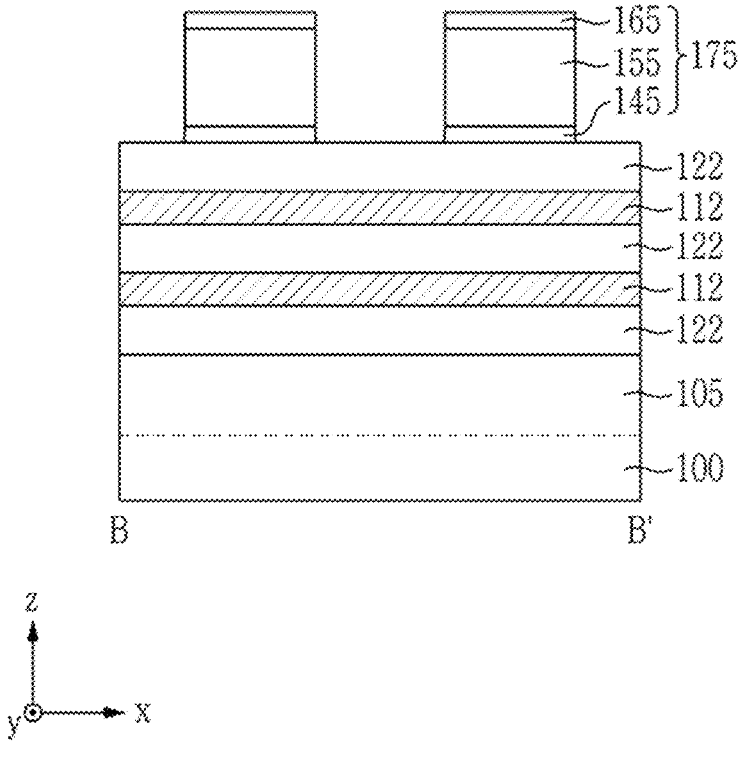
Figure 8:
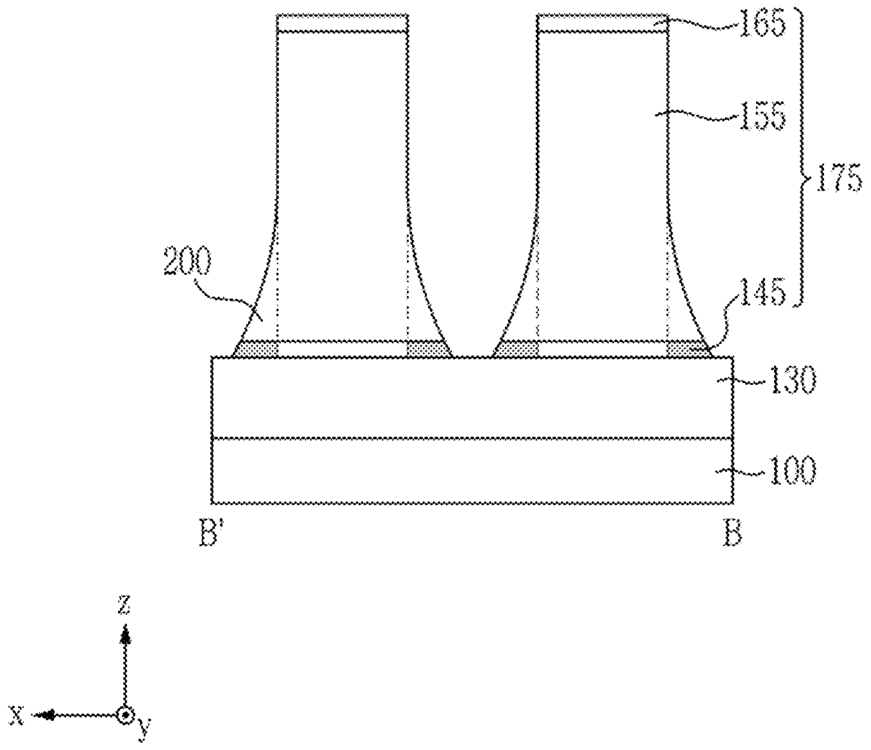
Figure 9:
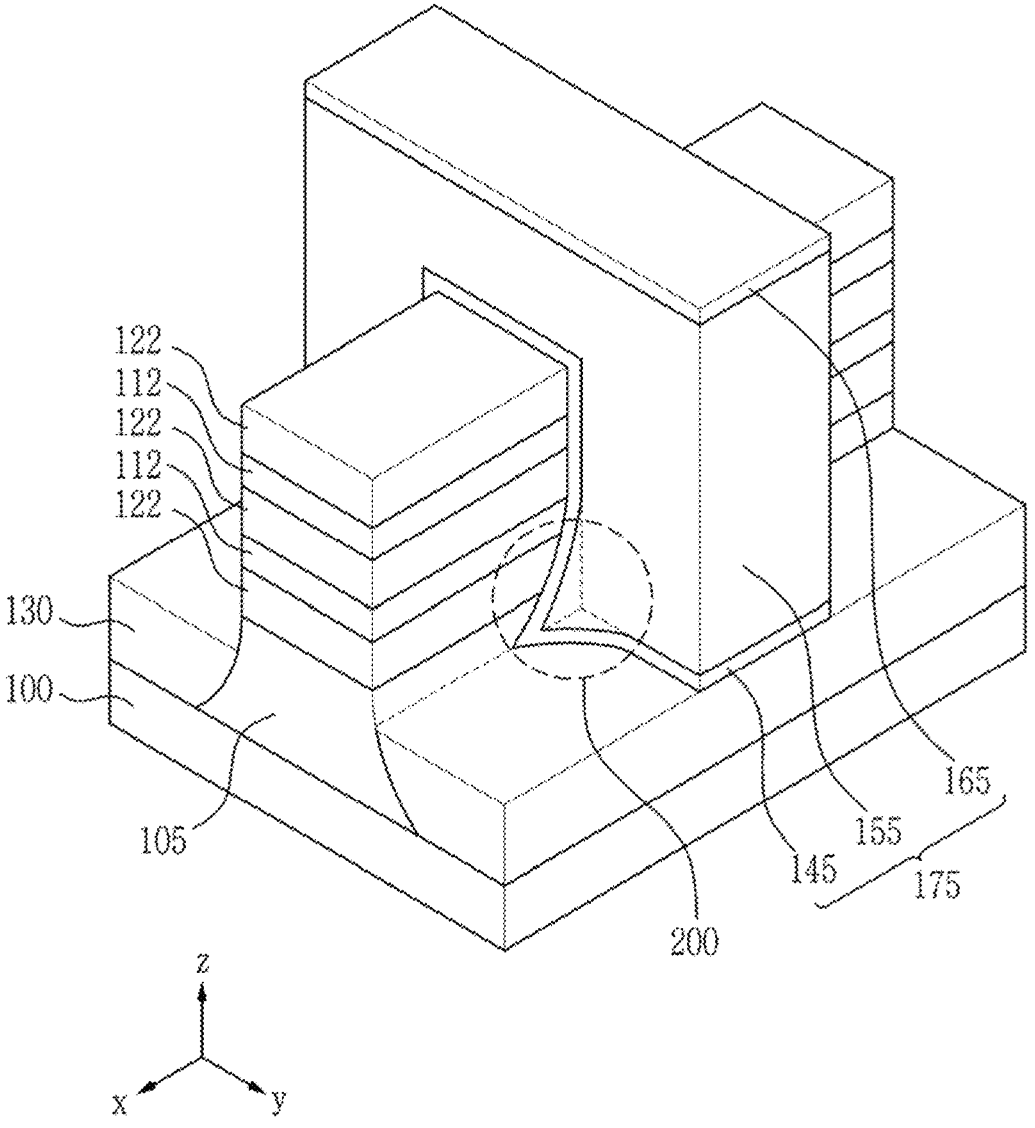
FIG. 9 is a perspective view that illustrates steps of a fabricating method of a semiconductor device according to an embodiment.
Figure 10:
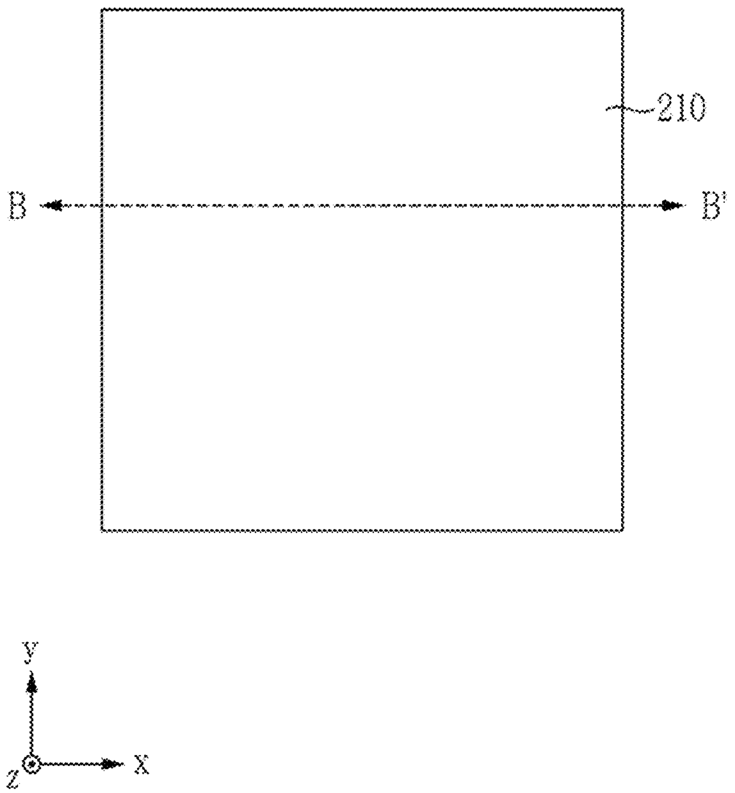
Figure 11:
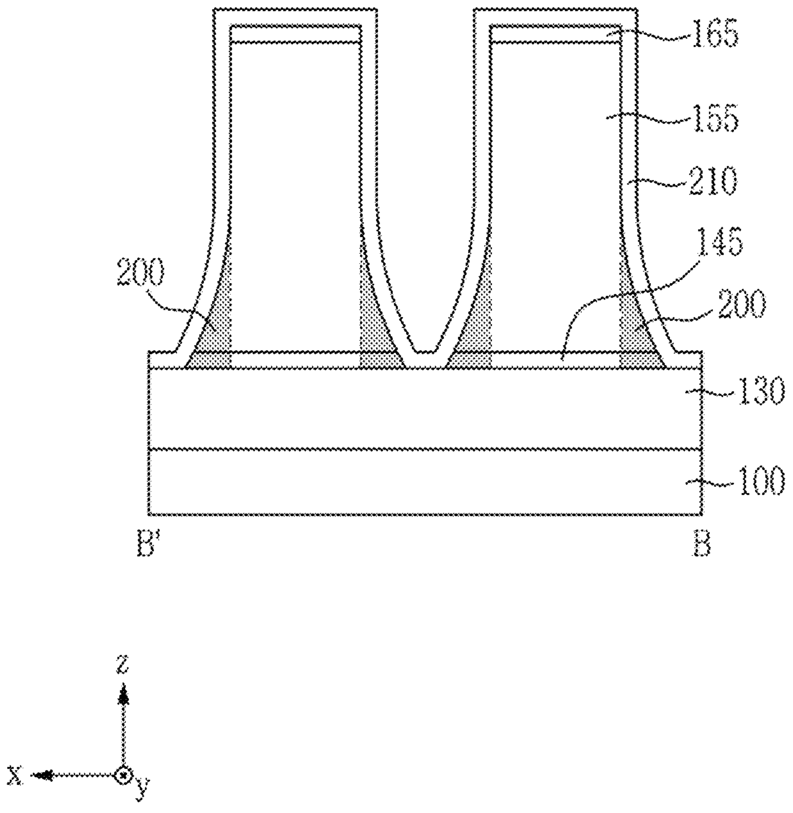
Figure 18:
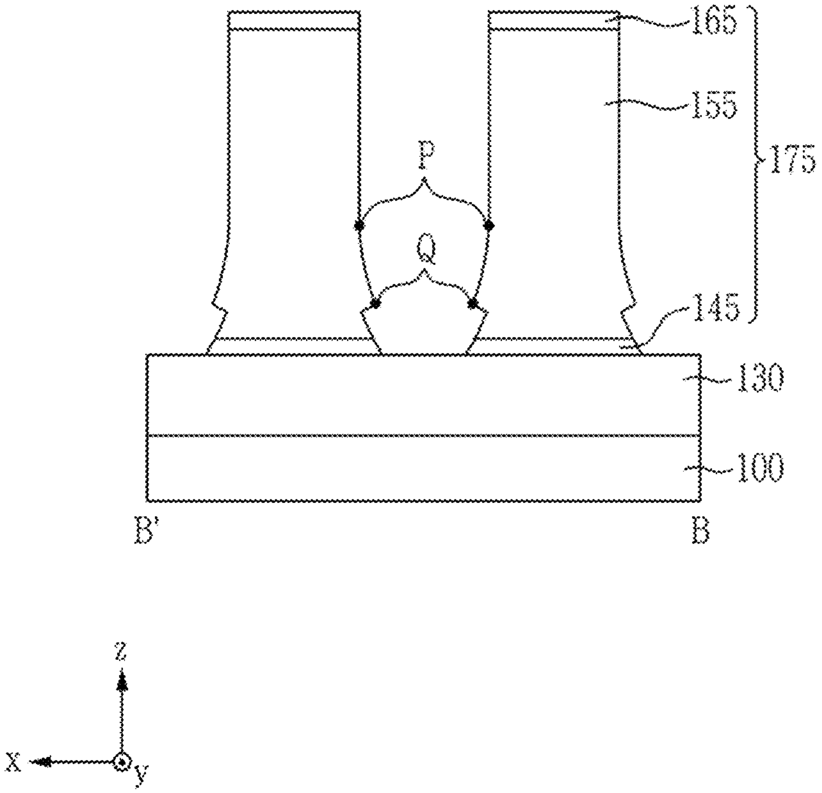
Figure 19:
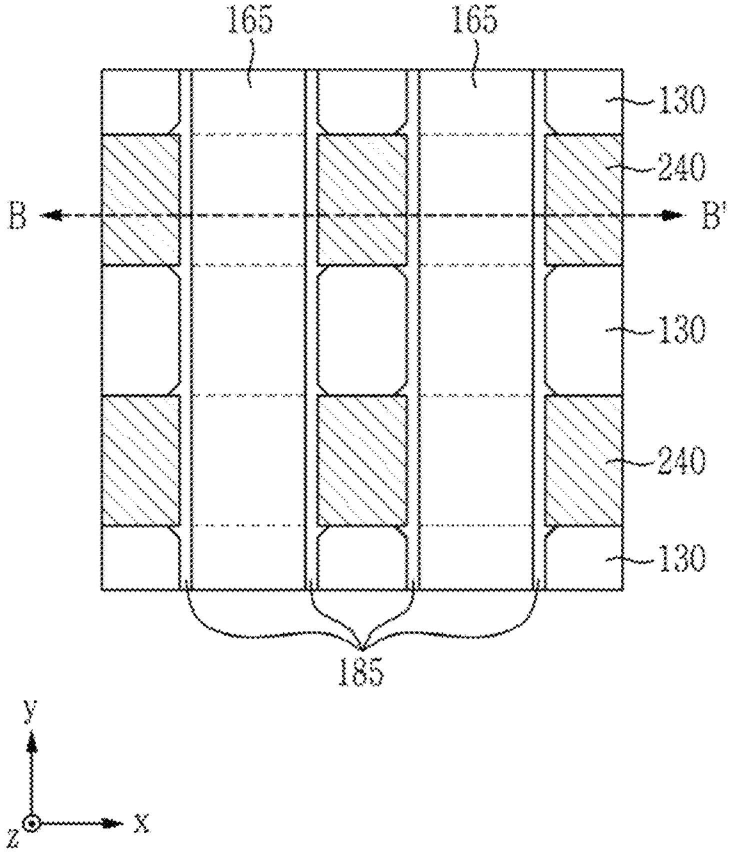
Figure 20:
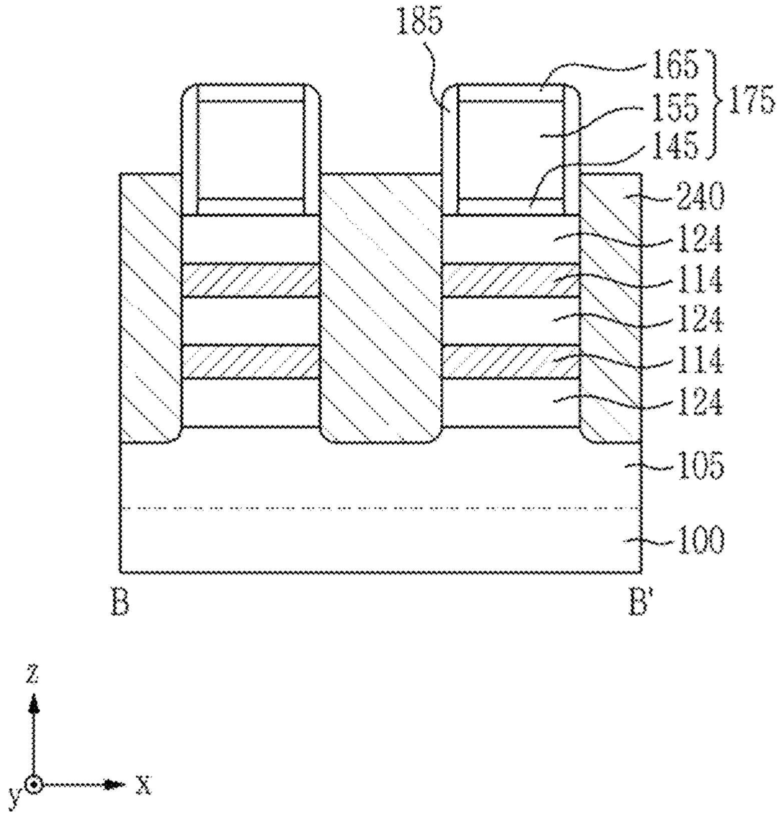
Figure 21:
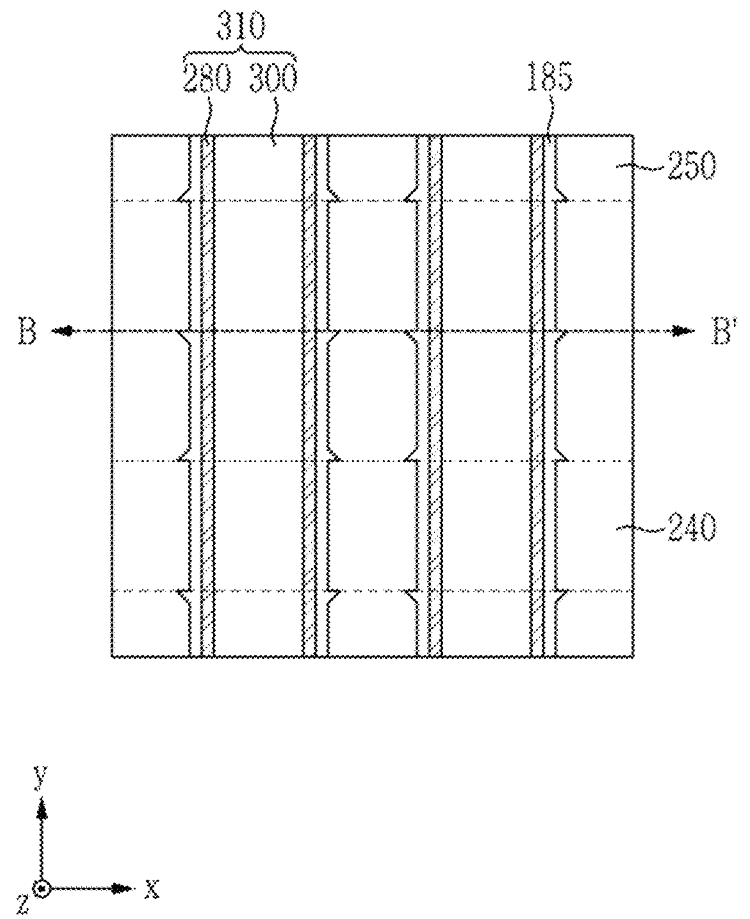

FIG. 1, FIG. 3, FIG. 5, FIG. 10, FIG. 19, and FIG. 21 are top plan views, FIG. 2 is a cross-sectional view taken along line A-A' of FIG. 1, FIG. 4 is a cross-sectional view taken along line A-A' of FIG. 3, FIG. 6 is a cross-sectional view taken along line A-A' of FIG. 5, FIG. 7 and FIG. 8 are cross-sectional views taken along line B-B' of FIG. 5, FIG. 9 is an enlarged perspective view of a portion D of FIG. 5, FIG. 11 is a cross-sectional view taken along line B-B' of FIG. 10, FIG. 12 to FIG. 18 are cross-sectional views that illustrate the removal of a skirt according to a process to be described below in a semiconductor device of FIG. 11, FIG. 20 is a cross-sectional view taken along line B-B' of FIG. 19, and FIG. 22 to FIG. 25 are cross-sectional views taken along line B-B' of FIG. 21.

Hereinafter, two directions parallel to the upper surface of the substrate 100 and crossing each other are defined as the first and second directions, respectively, and a direction perpendicular to the upper surface of the substrate 100 is defined as the third direction. In the following embodiments, the first and second directions may be orthogonal to each other. In FIG. 1 to FIG. 25, the first direction is an x-axis, the second direction is a y-axis, and the third direction is a z-axis. The first to third directions refer to both directions of the x-axis, y-axis, and z-axis, respectively.

In a cross-sectional view taken along the line B-B', the cross-sectional view when viewed from a lower side to an upper side of the top plan view is indicated as B-B' at a lower portion of the cross-sectional view, and the x-axis is indicated in the rightward direction. For example, FIG. 7 is a cross-sectional view taken along the line B-B' of FIG. 5, and a direction from the bottom to the top based on FIG. 5, that is, a direction of an active pattern, is shown, and indicated as B-B' at the lower portion of the cross-sectional view. However, the cross-sectional view when viewed from an upper side to a lower side of the top plan view is indicated as B'-B at a lower portion of the cross-sectional view, and the x-axis is indicated as the leftward direction. For example, FIG. 8 is a cross-sectional view taken along the line B-B' of FIG. 5, and a direction from the top to the bottom based on FIG. 5, that is, a direction facing back from an active pattern is shown, and indicated as B'-B at the lower portion of the cross-sectional view. In the drawings, even if the x-axis is illustrated to the left or to the right, the meaning of the x-axis direction is not changed.

Referring to FIG. 1 and FIG. 2, in an embodiment, a sacrificial layer 110 and a semiconductor layer 120 are alternately and repeatedly stacked on a substrate 100. In the drawing, two sacrificial layers 110 are inserted between three semiconductor layers 120, but the number of the semiconductor layers and the sacrificial layers is not necessarily limited thereto.

The semiconductor layer 120 is a single crystal suitable for a channel of a transistor, and includes, for example, silicon.

The sacrificial layer 110 includes a material that has an etch selectivity with respect to the substrate 100 and the semiconductor layer 120, such as silicon-germanium.

The substrate 100 includes a semiconductor material such as at least one of silicon, germanium, or silicon-germanium, or a group III-V compound such as at least one of GaAs, AlGaAs, InAs, or InGaAs. In some embodiments, the substrate 100 is one of a silicon-on-insulator (SOI) substrate or a germanium-on-insulator (GOI) substrate.

Referring to FIG. 3 and FIG. 4, in an embodiment, a hard mask that extends in the first direction (x) is formed on the topmost semiconductor layer 120, and by using the hard mask as an etching mask, the semiconductor layer 120, the sacrificial layer 110, and the upper portion of the substrate 100 are etched.

Accordingly, an active area 105 that extends in the first direction (x) is formed on the substrate 100, and an active pattern is formed that includes sacrificial lines 112 and semiconductor lines 122 alternately and repeatedly stacked on the active area 105.

In embodiments, the active pattern is a fin structure in which sacrificial lines 112 and semiconductor lines 122 are alternately and repeatedly stacked.

For example, when the semiconductor device to be fabricated is a FinFET, the active pattern has a form of a fin; when the semiconductor device to be fabricated is a GAAFET, the active pattern includes a plurality of nanowires; when the semiconductor device to be fabricated is an MBCFET, the active pattern includes stacked nanosheets; and when the semiconductor device to be fabricated is a ForkFET, the active pattern is a plurality of stacked nanosheets. The stacked nanosheets, which are the active pattern for fabricating an MBCFET, are a fin structure in which the sacrificial lines 112 and the semiconductor lines 122 are alternately and repeatedly stacked.

For example, a plurality of the fin structures are formed on the substrate 100 that are spaced apart from each other in the second direction (y).

After the hard mask is removed, an insulating layer that covers a sidewall of the active area 105 and forms an element isolating area 130 is deposited on the substrate 100.

Referring to FIG. 5 to FIG. 9, in an embodiment, a dummy gate structure 175 that partially covers the fin structure and the element isolating area 130 is formed on the substrate 100.

For example, a dummy gate insulating film, a dummy gate electrode film, and a dummy gate mask film are sequentially formed on the substrate 100 on which the fin structure and the element isolating area 130 are formed, and a photoresist pattern that extends in the second direction (y) is formed on the dummy gate mask film. The photoresist pattern is used as an etching mask to etch the dummy gate mask film, and a dummy gate mask 165 is formed on the substrate 100.

The dummy gate insulating film includes, for example, an oxide such as a silicon oxide; the dummy gate electrode film includes, for example, polysilicon; and the dummy gate mask film includes, for example, a nitride such as a silicon nitride.

Thereafter, a dummy gate electrode 155 and a dummy gate insulating pattern 145 are respectively formed on the substrate 100 by using the dummy gate mask 165 as an etching mask to etch the dummy gate electrode film and the dummy gate insulating film thereunder.

Accordingly, the dummy gate structure 175 is formed that includes the dummy gate insulating pattern 145, the dummy gate electrode 155, and the dummy gate mask 165 sequentially stacked on a portion of the active area 105 and the element isolating area 130 adjacent thereto.

For example, the dummy gate structure 175 extends in the second direction (y), and covers an upper surface of the fin structure and both sidewalls of the fin structure in the second direction.

Referring to FIG. 9, in an embodiment, a portion that contacts the sidewall of the fin structure and a portion that contacts the upper surface of the element isolating area 130 in the dummy gate structure 175 have inclined sidewalls rather than sidewalls that are perpendicular to the fin structure or the upper surface of the element isolating area 130. For example, in an etching process that forms the dummy gate structure 175, the lower portion of the dummy gate structure 175 in contact with the sidewall of the fin structure is not well patterned as compared to the upper portion of the dummy gate structure 175, and accordingly, the lower portion has an sidewall that is inclined with respect to the sidewall of the fin structure or the upper surface of the element isolating area 130, or the upper surface of the substrate 100.

Referring to FIG. 8 and FIG. 9, in an embodiment, a lower portion of the dummy gate electrode 155 and a portion of the dummy gate insulating pattern 145 that do not overlap an upper portion of the dummy gate electrode 155 in the third direction (z) are formed on both sidewalls of the fin structure in the second direction (y), which will now be referred to as a skirt 200 of the dummy gate structure 175. The skirt 200 of the dummy gate structure 175 has a form that spreads from the sidewall of the dummy gate structure 175 toward the lower portion thereof closer to the substrate 100.

FIG. 9 shows that the skirt is formed from a point midway between a highest point and a lowest point of a corner at which the fin structure and the dummy gate structure 175 intersect, but the formation position or shape of the skirt is not necessarily limited thereto. The formation position or shape of the skirt can vary depending on the etching process of the dummy gate electrode film and the dummy gate insulating film. Accordingly, FIG. 9 shows that the skirt is formed from the middle point of the corner at which the fin structure and the dummy gate structure 175 intersect, but the point at which the skirt is formed can range from the highest point of the corner at which the fin structure and the dummy gate structure 175 intersect to a point of a corner very close to the element isolating area. Referring to FIG. 10 to FIG. 16, in a fabricating method of a semiconductor device according to an embodiment, the skirt 200 of the dummy gate structure 175 is selectively removed.

For example, in an embodiment, referring to FIG. 10 and FIG. 11, a dummy dielectric layer 210 is formed that entirely covers the fin structure, the element isolating area 130, and the dummy gate structure 175.

The dummy dielectric layer 210 is formed of, for example, an oxide such as a silicon oxide or a low-k dielectric material such as SiCO. The dummy dielectric layer is entirely deposited on the fin structure, the element isolating area 130, and the dummy gate structure 175 through, for example, an atomic layer deposition (ALD) process.

Thereafter, the dummy dielectric layer 210 is etched through an anisotropic top-down etching method, the dummy dielectric layer 210 on the upper surface is removed and the dummy dielectric layer on the side surface remains without being removed. For example, when the dummy dielectric layer 210 is etched through an anisotropic top-down etching method, the upper surface of the fin structure, the upper surface of the element isolating area 130, the upper surface of the dummy gate structure 175, and the skirt 200 of the dummy gate structure 175 are selectively exposed.

As an anisotropic top-down etching method, a reactive ion etching method under mild conditions can be used.

Figure 12:
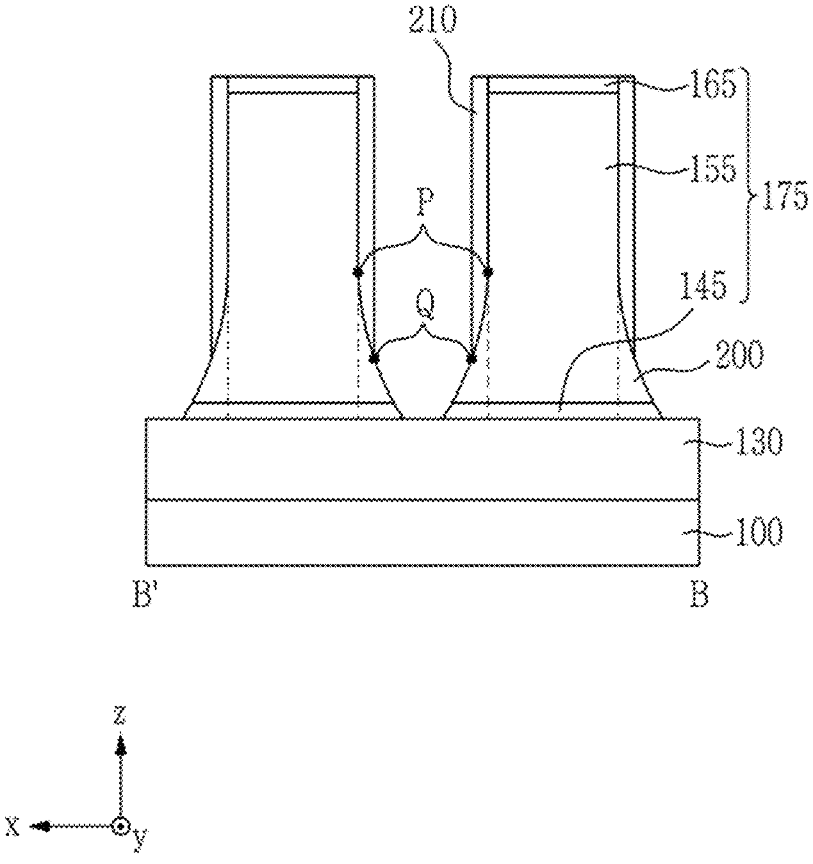

Referring to FIG. 12, in an embodiment, an upper portion of the skirt 200 of the dummy gate structure 175 that includes a starting point P is not exposed by being covered by the dummy dielectric layer 210. For example, the skirt 200 is covered by the dummy dielectric layer 210 from the point P at which the skirt 200 starts to a point Q at which the skirt 200 is exposed by the dummy dielectric layer 210.

The dummy dielectric layer 210 is thin, and has a thickness of, for example, about 0.1 to 10 nm so that the skirt 200 of the dummy gate structure 175 is maximally exposed.

Even if the thickness of the dummy dielectric layer 210 is controlled to be as thin as possible, some of the dummy dielectric layer 210 between the point and the point Q is not removed. Accordingly, in a fabricating method of a semiconductor device according to an embodiment, the dummy gate structure is formed with a specific shape, and the specific shape is also reflected in the gate structure of a semiconductor device fabricated according to a fabricating method described above.

The selectively exposed skirt 200 may be removed through an etching process or may be oxidized, and is removed in a subsequent process step of removing the dummy dielectric layer.

Figure 13:
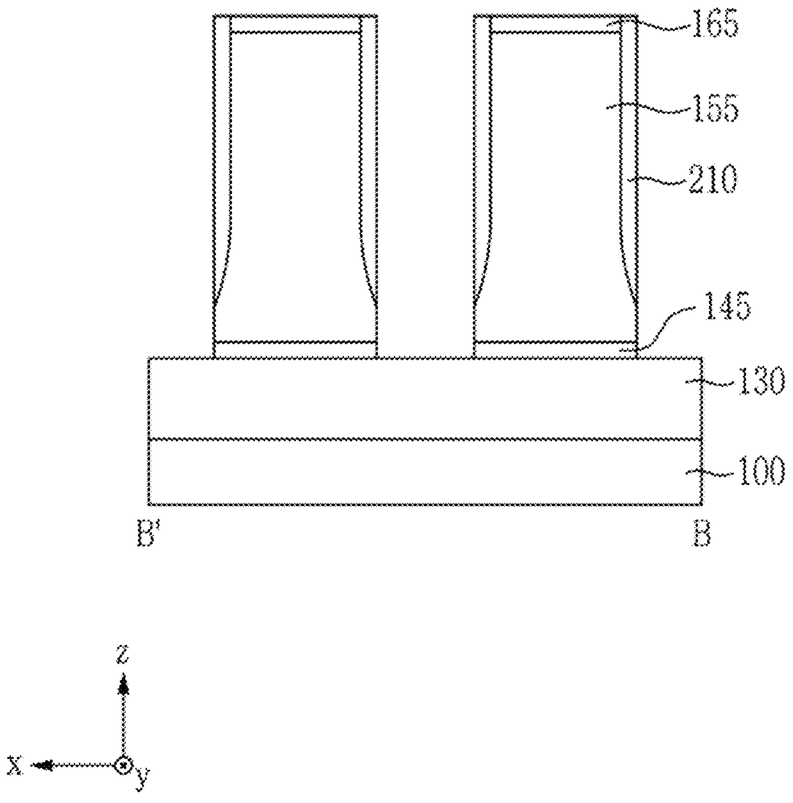

Referring to FIG. 13, in an embodiment, the selectively exposed skirt 200 is etched by, for example, a dry etching method. In a dry etching method, the skirt exposed by the anisotropic top-down etching method is removed so as to be parallel to the third direction (z).

Figure 14:
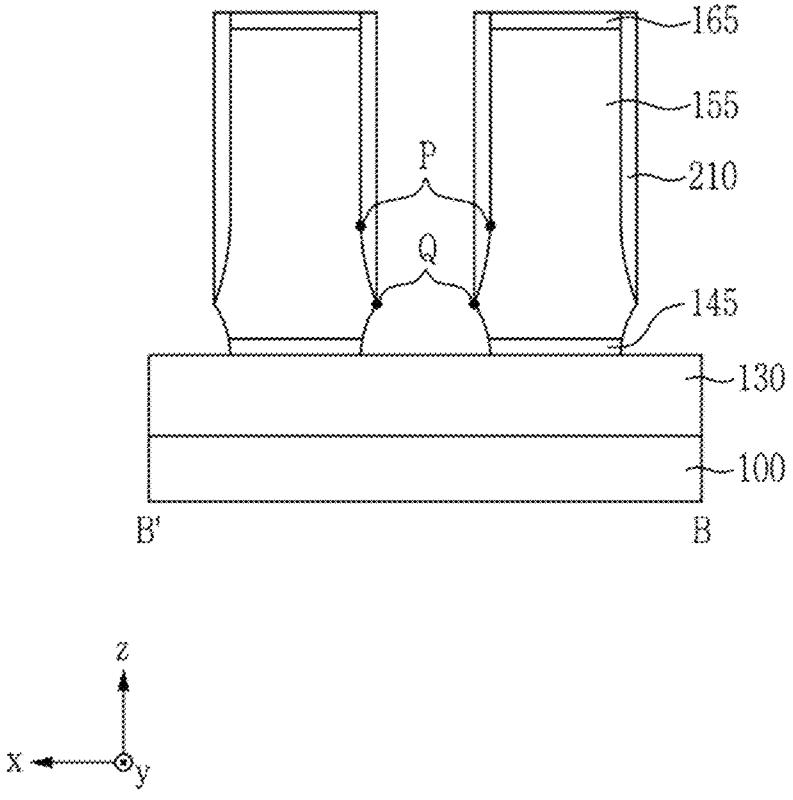

Referring to FIG. 14, in an embodiment, the selectively exposed skirt 200 is etched by, for example, a wet etching method. In a wet etching method, the skirt 200 exposed by the isotropic etching method is removed so that the width in the first direction (x) is less than the width at point Q where the skirt starts to be exposed. However, embodiments of the present disclosure are not necessarily limited thereto, and in an embodiment, the width in the first direction (x) becomes narrower below point Q, and then becomes wider.

The selectively exposed skirt is a lower portion of the dummy gate electrode 155 and a portion of the dummy gate insulating pattern 145. FIG. 13 and FIG. 14 show that the skirt 200 of the dummy gate insulating pattern 145 is etched together with the skirt 200 portion of the dummy gate electrode 155, but when the skirt 200 of the dummy gate electrode 155 is etched, a portion or all of the skirt 200 of the dummy gate insulating pattern 145 remains, and is removed in a subsequent process step of removing the dummy dielectric layer.

Figure 15:
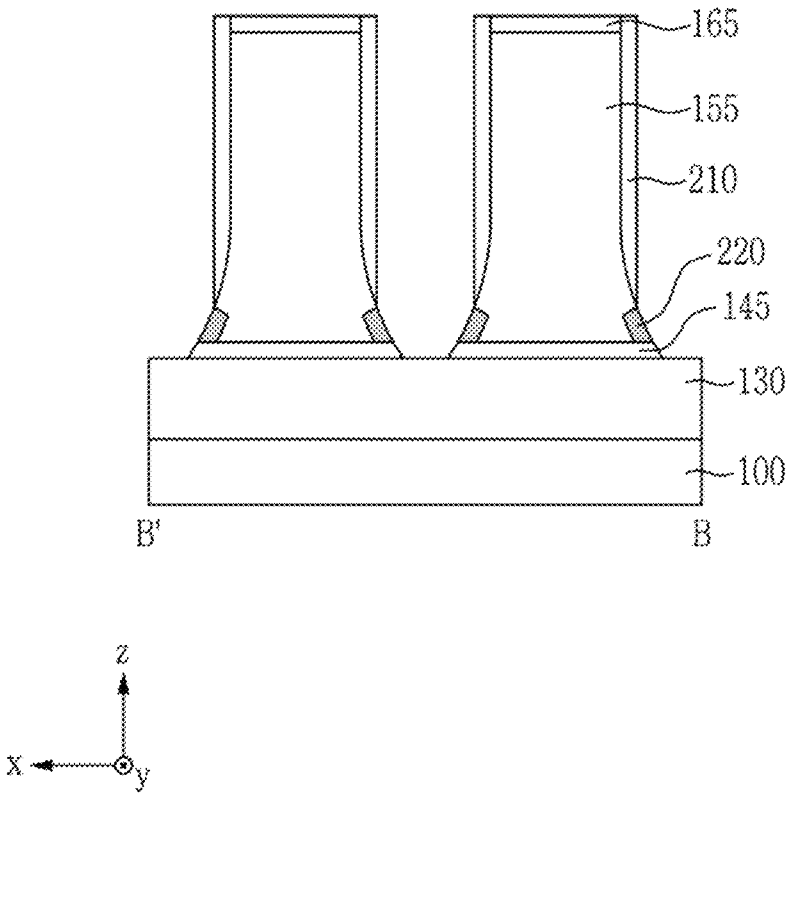

For example, referring to FIG. 15, in an embodiment, the selectively exposed skirt 200 is oxidized. When the selectively exposed skirt 200 is oxidized, an oxide film 220 is formed on the surface of the dummy gate electrode 155 portion of the skirt 200. The dummy gate electrode 155 is formed of, for example, polysilicon. Accordingly, a silicon oxide film 220 is formed on the selectively exposed surface of the dummy gate electrode 155 of the skirt 200. The oxidation process is performed at a relatively low temperature by using a plasma generating device that uses oxygen gas.

After etching or oxidizing the selectively exposed skirt 200, the remaining dummy dielectric layer 210 is removed. When the dummy dielectric layer 210 is removed, the skirt 200 portion of the dummy gate insulating pattern 145 that remains after the skirt 200 is etched is also removed. In addition, when the dummy dielectric layer 210 is removed, the oxidized skirt 220 portion and the skirt 200 portion of the dummy gate insulating pattern 145 exposed by the removal of the oxidized skirt 220 portion are also removed.

Figure 16:
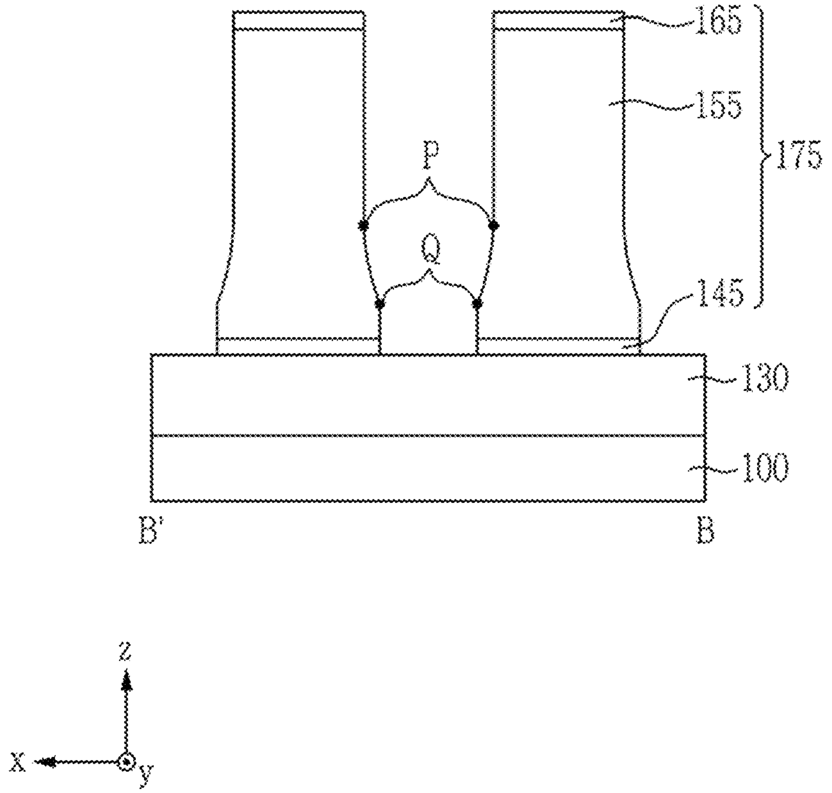
Figure 17:
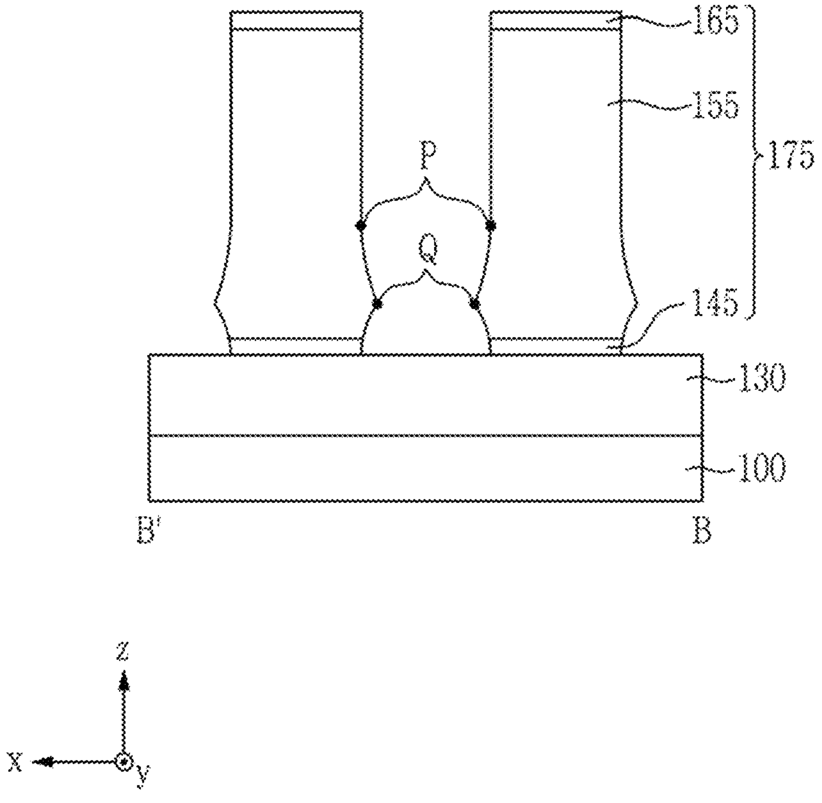

Referring to FIG. 16 to FIG. 18, in some embodiments, since the skirt 200 of the dummy gate structure 175 is selectively removed by removing the dummy dielectric layer 210, the dummy gate structure 175 is formed that has a unique lower shape.

Referring to FIG. 16, in an embodiment, since the skirt 200 of the dummy gate structure 175 is removed by a dry etching method, the dummy gate structure 175 has a first portion whose width in the first direction (x) widens from the point P to the point Q and a second portion whose width in the first direction (x) remains the same, below the first portion.

Referring to FIG. 17, in an embodiment, since the skirt 200 of the dummy gate structure 175 is removed by a dry etching method, the dummy gate structure 175 has a first portion whose width in the first direction (x) widens from the point P to the point Q and a second portion whose width in the first direction (x) becomes narrower, below the first portion. The width of the second portion in the first direction (x) may gradually become narrower, and be narrowest at the lowermost portion of the dummy gate structure; or may become narrower and then widen again, or may become narrower and remain the same.

Referring to FIG. 18, in an embodiment, since the skirt 200 of the dummy gate structure 175 is removed in a process of removing the dummy dielectric layer 210 after oxidation, the dummy gate structure 175 has a first portion whose width in the first direction (x) widens from the point P to the point Q and a second portion whose width in the first direction (x) becomes narrower below the first portion and then widens again.

Although the first portion has been described from the point P to the point Q with reference to FIG. 16 to FIG. 18, embodiments are not necessarily limited thereto. As described above, in other embodiments, the exposed skirt portion not covered by the dummy dielectric layer 210 is not removed by the anisotropic top-down etching process. For example, the point Q at which the exposure of the skirt starts and the point at which the skirt starts to be selectively removed may be the same or different. Accordingly, the first portion is an area from the point P at which the skirt starts to the point at which the skirt starts to be selectively removed.

Referring to FIG. 19 and FIG. 20, in an embodiment, a spacer 185 is formed on the sidewall of the dummy gate structure 175.

For example, after forming a spacer film on the substrate 100 on which the fin structure, the element isolating area 130, and the dummy gate structure 175 are formed, the spacer film is etched by anisotropic etching and the spacers 185 are formed that cover both sidewalls of the dummy gate structure 175 in the first direction (x).

Since the dummy gate structure 175 includes a first portion whose width in the first direction (x) widens, the spacer 185 is formed along an outline of the dummy gate structure 175. Accordingly, the top plan view of FIG. 19 shows that the spacer 185 that covers the first portion of the dummy gate structure 175. For example, FIG. 19 shows that the spacer 185 is formed on the first portion of the dummy gate structure 175 at a corner at which the fin structure and the dummy gate structure 175 intersect.

The spacer film can be formed through, for example, a deposition process such as a chemical vapor deposition (CVD) process, an atomic layer deposition (ALD) process, etc. The spacer film includes, for example, at least one of a nitride such as a silicon nitride, a silicon carbonitride, a silicon boronitride, or a silicon oxycarbonitride.

Thereafter, the upper surface of the active area 105 of the substrate 100 is exposed by etching the exposed fin structure by using the dummy gate structure 175 and the spacer 185 as an etching mask.

Accordingly, the sacrificial lines 112 and the semiconductor lines 122 formed under the dummy gate structure 175 and the spacer 185 are converted into sacrificial patterns 114 and semiconductor patterns 124, respectively, and the fin structure that extends in the second direction (y) is separated into a plurality of fin structures that are spaced apart from each other in the first direction (x). For example, each of the semiconductor patterns 124 is a channel for a transistor that includes the semiconductor pattern 124.

Hereinafter, for better understanding and ease of description, the dummy gate structure 175, the spacer 185 formed on both sidewalls thereof, and the fin structure therebelow will be referred to as a first structure. In an embodiment, the first structure extends in the second direction (y), and is includes a plurality of first structures that are spaced apart from each other along the first direction (x). In addition, a trench that exposes the active area 105 is formed between the first structures.

An epitaxial film 240 is formed on the upper surface of the active area 105 of the substrate 100 exposed by the trench. For example, the epitaxial film 240 is formed by performing a selective epitaxial growth (SEG) process using the upper surface of the active area 105 exposed by the trench as a seed. In an embodiment, the SEG process is performed by using, for example, a silicon source gas such as disilane ($Si_2H_6$) gas, and for example, a carbon source gas such as $SiH_3CH_3$ gas, and thus a single crystal silicon carbide (SiC) layer is formed. In an embodiment, the SEG process is performed by using, for example, only a silicon source gas such as disilane ($Si_2H_6$) gas, and thus a single crystal silicon layer is formed.

In an embodiment, the SEG process is performed by using, for example, a silicon source gas such as dichlorosilane ($SiH_2Cl_2$) gas and a germanium source gas such as germanium tetrahydride ($GeH_4$) gas, and thus a single crystal silicon-germanium (SiGe) layer is formed.

The epitaxial film 240 may be formed by, for example, a laser epitaxial growth (LEG) process or a solid phase epitaxy (SPE) process in addition to the SEG process.

For the epitaxial film 240 to serve as a source/drain layer of a transistor, impurity doping and heat treatment are additionally performed on the epitaxial film 240. For example, when the epitaxial film 240 includes a silicon carbide or silicon, the epitaxial film 240 is doped with n-type impurities and heat treated. Accordingly, the epitaxial film 240 serves as a source/drain layer of an NMOS transistor. In addition, when the epitaxial film 240 includes silicon-germanium, the epitaxial film 240 is doped with p-type impurities and heat treated. Accordingly, the epitaxial film 240 serves as a source/drain layer of a PMOS transistor.

In an embodiment, the epitaxial film 240 is formed on both sidewalls of the first structure in the first direction (x), respectively. For example, the epitaxial film 240 contacts the sidewalls of the semiconductor patterns 124 and the sidewalls of the spacer 185 in the fin structure. Through this process, a source/drain layer is formed that is electrically connected to the channel formed from the semiconductor patterns 124. In addition, the gate structure that replaces the dummy gate structure 175 is electrically insulated from the epitaxial film 240 by the spacer 185.

Figure 22:
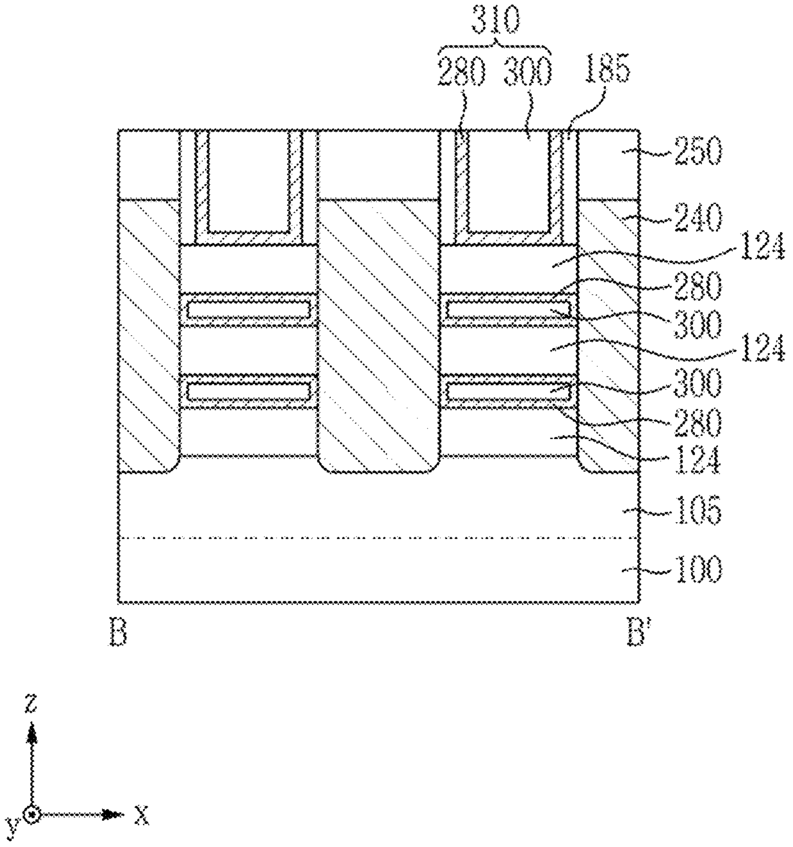

Referring to FIG. 21 and FIG. 22, in an embodiment, after forming an insulating film 250 on the substrate 100 that covers the first structure and the epitaxial film 240, the insulating film 250 is planarized until the upper surface of the dummy gate electrode 155 in the first structure is exposed. For example, the dummy gate mask 165 is also removed, and the upper portion of the spacer 185 is also partially removed. The insulating film 250 includes, for example, an oxide such as a silicon oxide.

The planarization process may be performed by a chemical mechanical polishing (CMP) process and/or an etch back process.

Thereafter, the exposed dummy gate electrode 155, and the dummy gate insulating pattern 145 and the sacrificial pattern 114 therebelow, are removed. The removal process is one or more of, for example, a wet etching process and/or a dry etching process. A trench that exposes the inner wall of the spacer 185 and the surface of the semiconductor pattern 124 is formed by the removal process. When the sacrificial pattern 114 contacts the active area 105, the upper surface of the active area 105 is also exposed by the trench.

Thereafter, the gate structure 310 that fills the trench is formed on the substrate 100.

Referring to FIG. 21 and FIG. 22, in an embodiment, a gate insulating film is conformally formed on the semiconductor pattern 124, the inner walls of the spacer 185 and the upper surface of the insulating layer 250 exposed by the trench, and a gate electrode film that fills the remaining portion of the trench is formed. When the upper surface of the active area 105 is exposed by the trench, the gate insulating film is also formed on the upper surface of the active area 105.

The gate insulating film is formed of, for example, at least one of a silicon oxide film, a silicon oxynitride film, a high dielectric film that has a higher dielectric constant than that of a silicon oxide film, or a combination thereof. The high dielectric film includes, for example, at least one of a metal oxide or a metal oxynitride. For example, the high dielectric film includes a metal oxide that has a high dielectric constant, such as a hafnium oxide, a tantalum oxide, or a zirconium oxide.

For example, the gate insulating film includes a silicon oxide film and a high dielectric film that has a dielectric constant higher than that of the silicon oxide film. For example, the silicon oxide film may be formed on a surface, such as the surface of the semiconductor pattern 124 or the upper surface of the active are 105, exposed by the trench by performing a thermal oxidation process on the surface exposed by the trench, or may be formed on the inner walls of the spacer 185 as well as the surface exposed by the trench through a chemical vapor deposition (CVD) process, an atomic layer deposition (ALD) process, etc. In addition, the high dielectric film is formed by one of a chemical vapor deposition (CVD) process, an atomic layer deposition (ALD) process, or a physical vapor deposition (PVD) process.

The gate electrode film is, for example, one or more of a work function control film, a metal film, or a combination thereof. The work function control film includes, for example, at least one of a titanium nitride, a titanium oxynitride, a titanium oxycarbonitride, a titanium silicon nitride, a titanium silicon oxynitride, a titanium aluminum oxynitride, a tantalum nitride, a tantalum oxynitride, a tantalum aluminum nitride, a tantalum aluminum oxynitride, a tungsten nitride, a tungsten carbonitride, or an aluminum oxide, etc. The metal film includes, for example, at least one of a metal such as titanium, aluminum, or tungsten, an alloy thereof, or a nitride or carbide thereof.

The work function control film or the metal layer may be formed through a chemical vapor deposition (CVD) process, an atomic layer deposition (ALD) process, or a physical vapor deposition (PVD) process.

After the gate electrode film is formed, the gate electrode film and the gate insulating film are planarized until the upper surface of the insulating film 250 is exposed to form the gate electrode 300 and the gate insulating pattern 280, respectively. The gate electrode 300 and the gate insulating pattern 280 form the gate structure 310.

The gate structure 310 forms a transistor together with the epitaxial film 240 that serves as a source/drain layer and the semiconductor pattern 124 that serves as a channel. The transistor may be an NMOS transistor or a PMOS transistor according to a conductivity type of an impurity doped in the epitaxial film 240. The transistor includes a plurality of the semiconductor patterns 124 stacked along the third direction (z), and thus is a multi-bridge channel field effect transistor (MBCFET).

The semiconductor device further includes a contact plug, a wire, etc., that are electrically connected to the epitaxial film 240 and/or the gate structure 310.

According to a fabricating method of a semiconductor device according to an embodiment, the gate structure 310 has a shape taken from a characteristic shape of the dummy gate structure 175.

For example, as shown in FIG. 23, the gate structure 310 includes, in the cross-section, a first portion in which a width of the gate structure 300 in the first direction (x) becomes wider from an upper portion of the gate structure 300 toward a lower portion closer to the substrate 100, and a second portion in which a width in the first direction (x) remains the same or becomes narrower below the first portion.

For example, the first portion overlaps only the sidewall in the second direction (y) of a lowermost semiconductor pattern 124 positioned closest to the substrate 100.

For example, the first portion overlaps the sidewall in the second direction (y) of the semiconductor pattern 124 subsequently positioned on the lowermost semiconductor pattern 124. For example, the first portion overlaps only the sidewall in the second direction (y) of the semiconductor pattern 124 subsequently positioned on the lowermost semiconductor pattern 124, based on its shape, or overlaps all of the sidewalls in the second direction (y) of the lowermost semiconductor pattern 124 and the semiconductor pattern 124 that are subsequently disposed thereon.

For example, the first portion overlaps the sidewall in the second direction (y) of the uppermost semiconductor pattern 124 farthest from the substrate 100. For example, the first portion overlaps only the sidewall in the second direction (y) of the uppermost semiconductor pattern 124, based on its shape, or overlaps the sidewall in the second direction (y) of the uppermost semiconductor pattern 124 and one or more or all of the semiconductor patterns 124 subsequently disposed thereon.

A specific shape of the gate structure 310 is that of the gate electrode 300. For example, the first portion of the gate structure 310 is an area of the gate electrode 300.

Referring to FIG. 23, in an embodiment, the gate structure 310, such as the gate electrode 300, is formed to have a first portion whose width in the first direction (x) becomes wider from the upper portion of the gate electrode 300 toward the lower portion thereof closer to the substrate 100, and a second portion whose width remains the same in the first direction (x) under the first portion.

Referring to FIG. 24 and FIG. 25, in some embodiments, the gate structure 310, such as the gate electrode 300, is formed to have a first portion whose width in the first direction (x) becomes wider from the upper portion of the gate electrode 300 toward the lower portion thereof closer to the substrate 100, and a second portion whose width in the first direction (x) becomes narrower under the first portion. casein an embodiment, as shown in FIG. 24, the second portion has a shape whose width in the first direction (x) narrows from the first portion to the element isolating area 130. In an embodiment, as shown in FIG. 25, the second portion has a shape whose width in the first direction (x) narrows and then widens from the first portion toward the element isolating area 130.

The gate structure 310 of this shape can suppress an electrical short between the gate electrode and the source/drain layer, and can suppress a decrease in yield by preventing the source/drain layer from being damaged while the dummy gate structure is removed during a gate last process or a replacement gate process.

While embodiments of this disclosure have been described in connection with what is presently considered to be practical embodiments, it is to be understood that embodiments of the disclose are not necessarily limited to disclosed embodiments, but, on the contrary, are intended to cover various modifications and equivalent arrangements included within the spirit and scope of the appended claims.

What is claimed is:

1. A semiconductor device, comprising:

an active area that protrudes in a direction perpendicular to an upper surface of a substrate and that extends in a first direction parallel to the upper surface of the substrate;

an element isolating area formed on the substrate and around the active area;

a channel formed on an upper surface of the active area and that extends in the first direction;

a gate structure that surrounds at least two surfaces of the channel and that extends in a second direction perpendicular to the first direction;

a spacer formed on both sidewalls of the gate structure in the first direction; and a source/drain layer in contact with both sidewalls in the first direction of the channel and insulated from the gate structure by the spacer, wherein the gate structure includes in a cross-section, a first portion whose width in the first direction increases from an upper portion of the gate structure toward a lower portion closer to the substrate, a second portion whose a width in the first direction remains the same or decreases below the first portion, and a third portion whose width in the first direction remains the same above the first portion, and wherein a boundary between the first portion and the third portion of the gate structure is disposed at a level lower than an upper surface of the channel.

2. The semiconductor device of claim 1, wherein the gate structure surrounds one channel and an upper surface and a sidewall of the channel in the second direction.

3. The semiconductor device of claim 1, wherein the gate structure surrounds a plurality of channels and upper and lower surfaces and sidewalls of at least some of the plurality of channels in the second direction.

4. The semiconductor device of claim 1, wherein the gate structure includes a gate insulating pattern and a gate electrode, and wherein the first portion and the second portion of the gate electrode do not overlap the active area and the channel in a third direction perpendicular to the first direction and the second direction.

5. The semiconductor device of claim 4, wherein the gate electrode includes, in a cross-section, a first portion whose width in the first direction increases from an upper portion of the gate electrode toward a lower portion closer to the substrate, and a second portion whose width in the first direction remains the same below the first portion.

6. The semiconductor device of claim 4, wherein the gate electrode includes, in a cross-section, a first portion whose width in the first direction increases from an upper portion of the gate electrode toward a lower portion closer to the substrate, and a second portion whose width in the first direction decreases below the first portion.

7. The semiconductor device of claim 4, wherein the gate electrode includes, in a cross-section, a first portion whose width in the first direction increases from an upper portion of the gate electrode toward a lower portion closer to the substrate, and a second portion whose width in the first direction decreases and then increases below the first portion.

* * * * *